United States Patent [19]

Cachier

[11] 4,126,932
[45] Nov. 28, 1978

[54] STRUCTURE AND PROCESS FOR MILLIMETRIC WAVE SOURCES INTEGRATED IN A RADIAL WAVEGUIDE

[75] Inventor: Gerard Cachier, Paris, France

[73] Assignee: Thomson-CSF, Paris, France

[21] Appl. No.: 727,652

[22] Filed: Sep. 29, 1976

[30] Foreign Application Priority Data

Oct. 2, 1975 [FR] France .............................. 75 30236

[51] Int. Cl.² ........................ H01P 11/00; H01P 3/00; H01L 21/20; H01L 23/50
[52] U.S. Cl. ....................................... 29/580; 29/589; 29/591; 333/95 R; 333/97 R; 333/98 R
[58] Field of Search ................ 333/84 R, 95 R, 98 R, 333/97 R, 33, 34, 35, 83 R; 357/51; 307/317; 331/117 D, 96, 97, 101; 330/56, 31, 34, 38 M; 29/600, 601, 580, 589, 590, 591

[56] References Cited
U.S. PATENT DOCUMENTS

| 3,675,314 | 7/1972 | Levi ........................................ 357/56 |
| 3,689,993 | 9/1972 | Tolar ................................... 29/580 X |
| 3,701,049 | 10/1972 | Van Iperen et al. .............. 331/96 X |
| 3,718,869 | 2/1973 | Gerlach ............................ 333/34 X |
| 3,842,361 | 10/1974 | Quirk .................................. 331/96 X |
| 3,874,918 | 4/1975 | Nechtow et al. ................... 357/56 X |

Primary Examiner—Alfred E. Smith
Assistant Examiner—Marvin Nussbaum
Attorney, Agent, or Firm—Oblon, Fisher, Spivak, McClelland & Maier

[57] ABSTRACT

A structure consisting of a semiconductive device e.g. an IMPATT diode destined to transmit high frequency electromagnetic waves through a radial waveguide integral with the structure, forming a "easy to handle" unit. A fabrication process allowing a large number of units to be made utilizing batch processing techniques, is provided. The process includes forming a plurality of mesa diodes on a semiconductor wafer, coating the wafer with a first insulating layer (filling the intervals between the mesa tables), then depositing on the wafer a plate of a solid dielectric with openings for access to the upper part of diodes. The diodes are spaced enough to allow forming around each of them a radial waveguide using a portion of the solid dielectric for propagation medium and for walls, on one hand a metallization extending the biassing electrodes of the upper parts of diode, and on the other hand, a metallic base supporting the assembly after grinding of the substrate of the wafer. The diameter of the radial waveguide is of the order of one wavelength, measured in the solid medium.

6 Claims, 10 Drawing Figures

STRUCTURE AND PROCESS FOR MILLIMETRIC WAVE SOURCES INTEGRATED IN A RADIAL WAVEGUIDE

The invention relates to electromagnetic wave sources, more particularly to wave sources which operate at very high frequency (millimetric waves).

A millimetric wave source which has to transmit at hyper-frequency either in the open air or in a wave guide currently comprises at least:

a unit electronic component, for example an IMPATT diode (Impact Avalanche and Transit Time diode);

biassing means comprising a socket connecting the component to an electrical d.c. feed source;

impedance adapting means between the electronic component and the propagation medium, for example in the form of a resonant cavity opening onto a horn antenna or a wave guide.

An embodiment such as this has the following disadvantages:

complexity of the contacting means for biassing;

high cost both of the contacting means and of the adapting means due to the smallness of the diode and the dimensions of the horn or wave guide, the manufacture of these means being in the sphere of precision mechanics.

The present invention obviates these disadvantages.

According to the invention, there is provided a structure comprising in a central region an electromagnetic wave source forming a block with a metallic base and a metallic electrode and, in a peripheral region, a radial waveguide constituted by a solid dielectric medium limited by walls constituted by extensions of said base and said electrode.

According to another important aspect of the invention, the method by which a plurality of structures are manufactured is a batch process comprising the following steps:

(a): forming a plurality of sources by mesa attack of a semiconductor wafer comprising a substrate and various epitaxial layers;

(b): filling with an insulating medium the gaps between the sources formed in the step (a), and depositing source electrodes;

(c): depositing the insulating medium intended to form the dielectric medium of a radial waveguide;

(d): depositing a metal coating constituting for each structure the extension of its source electrode;

(e): grinding the substrate and applying metal constituting a metallic base for structures.

The invention will be better understood and other features thereof will become apparent from the following description in conjunction with the accompanying drawings, wherein:

FIG. 1 shows, partly in section, a semiconductor wafer 10, for example of silicon, which has been subjected to various treatments so that, at the starting point of the process according to the invention, it comprises:

a substrate 1 with $N^+$ doping on which there have been formed, for example by successive epitaxial deposition;

a layer 2 of silicon with N-type doping;

a layer 3 of silicon with P-type doping;

a layer 4 of silicon with $P^+$-type doping.

The assembly is capable of allowing the collective production of a plurality of IMPATT diodes.

Figure 1:
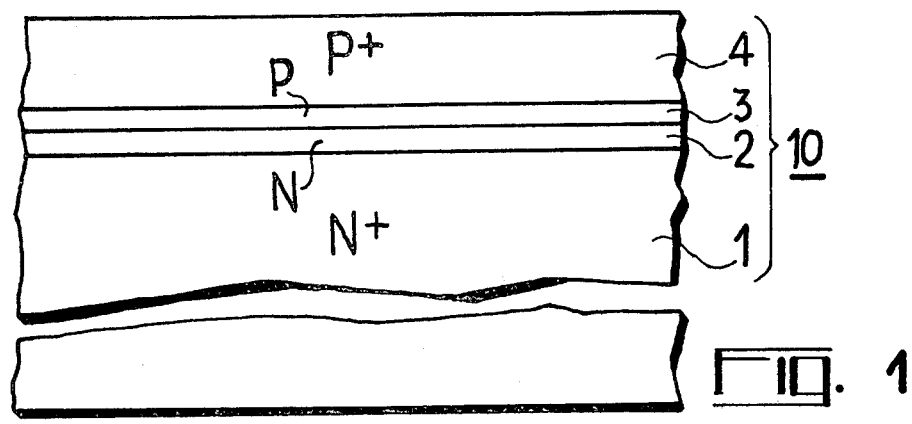
FIGS. 1 to 8 show various stages of one example of the process according to the invention.
Figure 2:
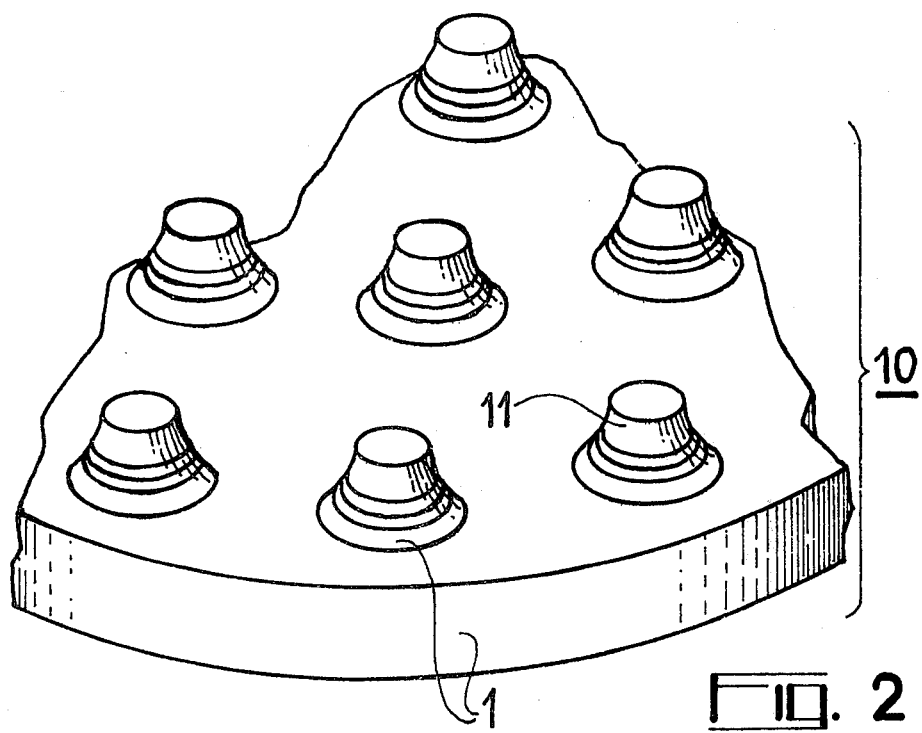

FIG. 2 is a perspective view of a fragment of the wafer at the end of the step (a). "Mesa" tables 11 have been obtained by a known masking method, followed by a chemical treatment. The drawing shows that the chemical treatment has affected all the layers and part of the substrate. The upper part of each table is for example a circle with a diameter of 50 microns. The distance between two neighbouring tables is much larger than the diameter of each table, for instance 2000 micrometers i.e. a quantity of the order of a fraction of the wavelength in the open air (5 mm at a frequency of 60 Gc/s).

Figure 3:
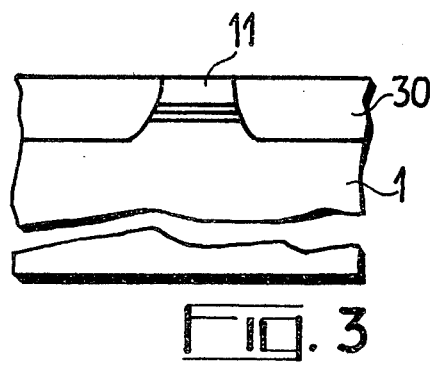
Figure 4:
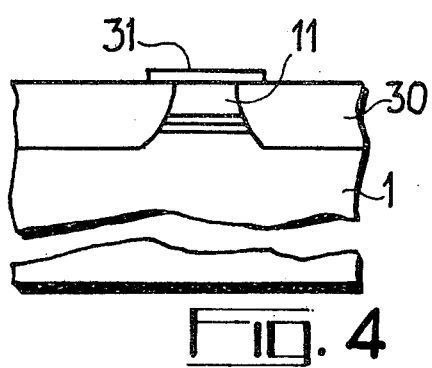
Figure 5:
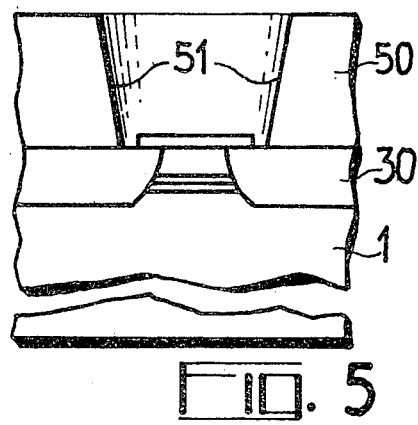

FIGS. 3 and 4, which are partial sections through the wafer 10 showing only one table 11, correspond to two stages of step (b). The insulating filling 30 re-establishes the flatness of the wafer 10. This filling is capable of having a thickness, from one to several tens of microns. Accordingly, precautions have to be taken to prevent the device from becoming fragile under heat. This result may be obtained for example by employing a glass commonly used for this purpose in the form of very small beads. It is also possible to use polyimide resin.

A metal deposit 31, shown in FIG. 4, forms the electrode of the diode. The metal deposit in question is, for example, a deposit of chromium and gold formed by evaporation and condensation in a known apparatus.

The following steps are illustrated in the form of a partial section through the wafer, only one diode being shown. In order to constitute a radial waveguide around the diode, the insulation filling layer is deemed much too thin. It is necessary to deposit over the layer 30 around the electrode 31 a considerable thickness of insulating medium 50 (glass or pure silicon of high resistivity). To this end, since it is not possible to adopt the same method as for the layer 30 in view of the fact that it is intended to reach up to 20 or 30 times the thickness of that layer, it is preferred to bond a plate 50 of glass of fused quartz type or of pure silicon, for example by means of a polymerisable resin. This plate was formed beforehand with openings 51, for example by machining, by sand blasting or by chemical treatment so as to allow access to the electrode 31.

Figure 6:
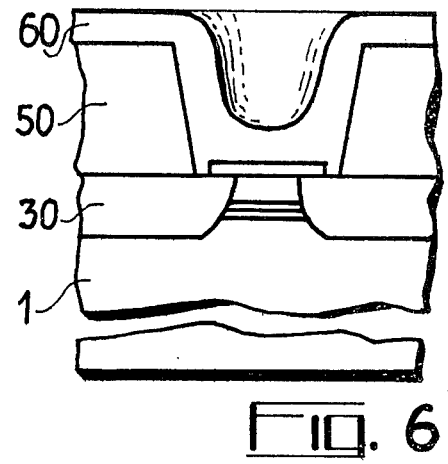
Figure 7:
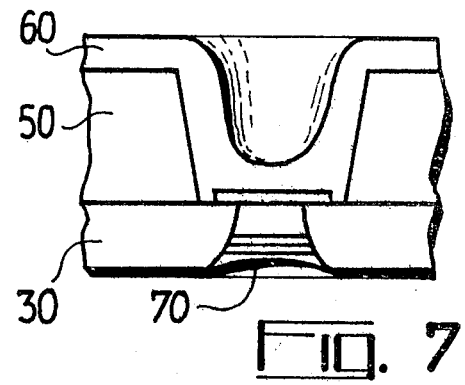
Figure 8:
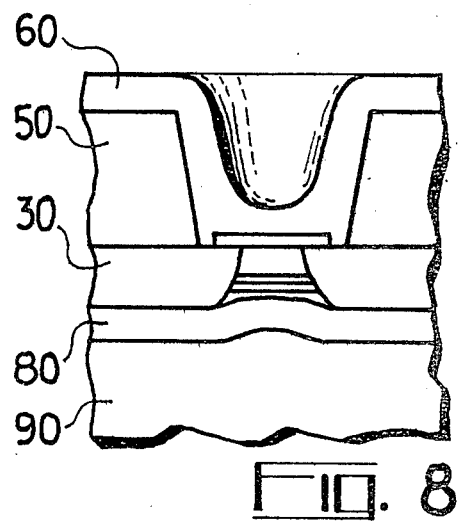

At the step (d), a metallic coating 60, for example of pure gold, is deposited in such a way that it covers the entire free surface opposite the substrate (FIG. 6). At step (e) the substrate is ground so as to expose the insulating filling layer (FIG. 7) which creates a slight cavity 70 marking the base of the "mesa" table. Then this surface is coated with a thick metal coating 80 similar to the metal coating 60 on the other surface of the wafer (FIG. 8). Finally, the assembly is brazed on a metal base 90.

Figure 9:
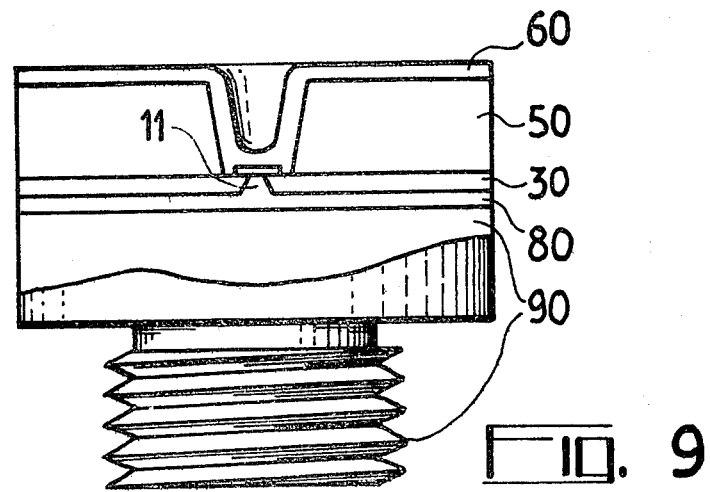
FIGS. 9 and 10 show two different embodiments of the structure according to the invention.

After cutting the wafer, unit structures are obtained. One such structure is shown in FIG. 9. It constitutes an integrated circuit comprising a millimetric wave source (the actual diode) and a radial waveguide between:

an electrical and thermal mass (metal deposit 80, base 90) much larger than the diode;

a metallic part forming an electrode and, in addition, a thermal dissipator (metal deposit 60);

a radial waveguide having metallic walls constituted by the base 90 and the metal deposit 60, and containing in majority the dielectric medium constituting the plate 50.

The diameter of the structure is for instance of the order of a wavelength, measured in the dielectric medium. It is well known that this wavelength is shorter in a medium the dielectric constant of which is higher than 1. In a "fused quartz" glass, this constant is of the order of 4. The wavelength in the dielectric is 2 times lower than in vacuum ($\sqrt{4} = 2$). In a silicon medium the wavelength would be 3 times lower.

Figure 10:
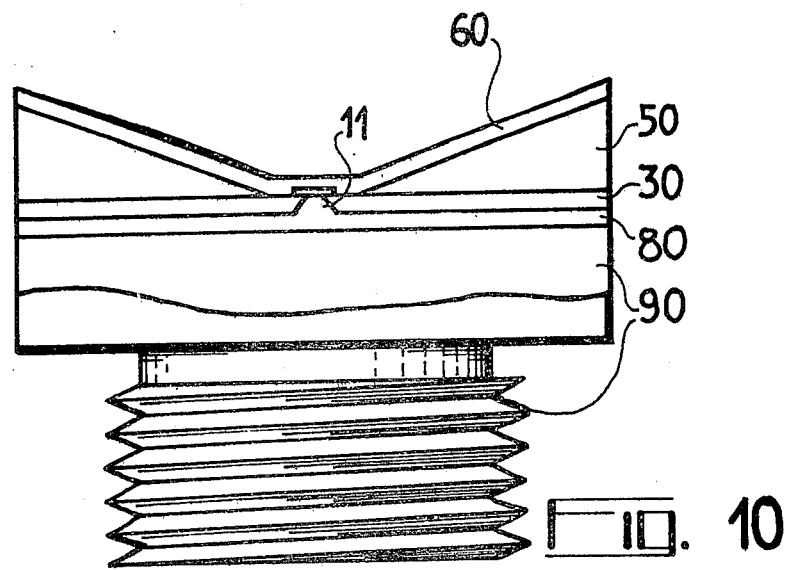

In a so-called "biconical line" variant, shown in FIG. 10, two cones of a solid dielectric are placed on either side of the diode, replacing the plate 50. A diode of this type is able to emit in two opposite directions. The upper part of the base 90 is rectangular.

The cones of the variant are compatible with a collective manufacturing process. In this case, the diodes formed on the disc have to be spaced sufficiently apart from one another to enable the cones to be machined in the plate 50 by a mechanical or chemical method.

What I claim is:

1. A batch process for manufacturing a plurality of electromagnetic wave sources destined to operate on millimetric waves, each consisting of a diode embedded in a radial waveguide including a dielectric medium, comprising the following steps:
   (a) forming mesa tables in a wafer containing a diode structure;
   (b) coating the wafer with an insulating filling layer to reestablish the flatness of the wafer and then forming a metal deposit onto the mesa tables to serve as diode electrodes;
   (c) bonding to the insulating filling layer a plate of a dielectric medium previously formed with openings to allow access to the electrodes;
   (d) coating the wafer with a first metallic layer covering the plate of dielectric medium and the electrodes through the openings;
   (e) grinding the side of the wafer opposite the first metallic layer to lay bare the insulating filling layer;
   (f) coating the ground side of the wafer with a second metallic layer thicker than the first metallic layer;
   (g) cutting the wafer into a plurality of individual sources centered on the electrodes, the sources including a part of the dielectric medium coated with the metallic layers as the radial waveguide.

2. The process of claim 1 wherein the wafer is of silicon and the insulating filling layer is of glass in beads.

3. The process of claim 1 wherein the insulating filling layer is of polyimide resin.

4. The process of claim 1 wherein the wafer is of silicon and the insulating filling layer and the dielectric medium are of glass.

5. The process of claim 1 wherein the wafer is of silicon, the insulating filling layer is of glass and the dielectric medium is of pure silicon.

6. The process of claim 1 wherein said part of the dielectric medium has a diameter of the order of the wavelength measured in the dielectric medium to operate on a millimetric wavelength of the same order.

* * * * *